United States Patent [19]
Lin et al.

[11] Patent Number: 5,378,648
[45] Date of Patent: Jan. 3, 1995

[54] SITU STRINGER REMOVAL DURING POLYSILICON CAPACITOR CELL PLATE DELINEATION

[75] Inventors: Audrey P. Lin, Meridian; Guy T. Blalock, Boise, both of Id.

[73] Assignee: Micron Technology, Inc., Boise, Id.

[21] Appl. No.: 161,506

[22] Filed: Dec. 2, 1993

Related U.S. Application Data

[63] Continuation-in-part of Ser. No. 914,189, Jul. 15, 1992, abandoned.

[51] Int. Cl.$^5$ .................................. H01L 21/302
[52] U.S. Cl. ................................... 437/52; 437/228; 156/643; 156/646; 156/653
[58] Field of Search ............... 156/643, 640, 656, 657, 156/653; 437/52, 228, 919

[56]  References Cited
U.S. PATENT DOCUMENTS

| | | | |
|---|---|---|---|
| 4,214,946 | 7/1980 | Foaget et al. | 156/643 |
| 4,310,380 | 1/1982 | Flamm et al. | 156/643 |
| 4,414,057 | 11/1983 | Bourassa et al. | 156/643 |
| 4,668,338 | 5/1987 | Mayden et al. | 156/643 |
| 4,741,799 | 5/1988 | Chen et al. | 156/643 |
| 4,799,991 | 1/1989 | Dockrey | 156/643 |
| 5,013,398 | 5/1991 | Long et al. | 156/643 |
| 5,110,408 | 5/1992 | Fjuii et al. | 156/643 |
| 5,110,411 | 5/1992 | Long | 156/656 |
| 5,167,762 | 12/1992 | Carr et al. | 156/657 |

*Primary Examiner*—T. N. Quach
*Attorney, Agent, or Firm*—Kevin D. Martin

[57]  ABSTRACT

Capacitors such as storage cells for Dynamic Random Access Memories are formed in a process for etching a polycrystalline silicon layer to form a storage cell during the manufacture of a semiconductor device. The etch results in a cell having reduced undercutting of the poly cell, and eliminates the formation of poly stringers. The inventive etch comprises the use of $NF_3$ and/or $SF_6$ during a magnetically enhanced low pressure reactive ion etch using a carbon-free etch gas of $Cl_2$.

21 Claims, 3 Drawing Sheets

SITU STRINGER REMOVAL DURING POLYSILICON CAPACITOR CELL PLATE DELINEATION

This is a continuation-in-part of application Ser. No. 07/914,189, filed Jul. 15, 1992, now abandoned.

FIELD OF THE INVENTION

This invention relates to the field of semiconductor manufacture. More specifically a method of removing polycrystalline silicon stringers from between storage plates is described.

BACKGROUND OF THE INVENTION

In the manufacture of semiconductors, several process steps are required to produce a functional die. A wafer of a starting material such as silicon or gallium arsenide is layered with oxide, poly, nitride, photoresist, and other materials in various configurations, depending on the type and design of the device which is being produced. Each step may require the local deposition, growth, or other formation of one of the above listed materials (patterning), or a blanket layer of the material may be laid down and a pattern etched away with chemicals or abraded away by particles. The etch step described may be a single etch step, or a series of etches.

In dynamic semiconductor memory storage devices it is essential that storage node capacitor cell plates be large enough to retain an adequate voltage level in spite of parasitic capacitances, noise, and leakage that may be present during circuit operation. As is the case for most semiconductor integrated circuitry, circuit density is continuing to increase at a fairly constant rate. The issue of maintaining storage node capacitance is also important as the density of DRAM arrays continue to increase for future generations of memory devices. The ability to densely pack storage cells while maintaining required storage capabilities is a crucial requirement of semiconductor manufacturing technologies if future generations of expanded memory array devices are to be successfully manufactured. One method of maintaining, as well as increasing, storage node size in densely packed memory devices is through the use of "stacked storage cell" design. With this technology, planar layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with interplate insulative layers having a high dielectric constant.

As shown in FIG. 1, the stacked capacitor design includes a substrate 10, source 12 and drain 14 regions, field 16 and gate 18 oxide, word lines 20 or "runners" (manufactured from pillars of poly 22, tungsten silicide 24, and oxide 26, for example), a layer of dielectric 28 such as tetraethyl orthosilicate overlying the word lines, a capacitor storage cell plate 30 interposed between every other pair of word lines 20, a top plate of the capacitor 32, digit (bit) lines 34, and various other dielectric layers 36. Other features which are not shown, such as P and N wells, may be necessary for proper functioning of the device and are easily determined by one of skill in the art.

As shown in FIG. 2 the cell plate is ideally formed by first laying down a patterned layer of photoresist 44 over a layer of poly 42. As shown in FIG. 3 the poly layer (as well as other exposed layers) is isotropically etched to isolate the cell plates 30.

As used herein, "anisotropic" etch refers to a directional etch in which the etch rate in one direction, usually vertically, greatly exceeds the etch rate in other directions. Directional etching is normally achieved by placing the wafer or substrate to be etched on a biased electrode. The applied bias acts to focus charged plasma particles down to the electrode in a substantially perpendicular direction. Advantages of anisotropic etching include reduced sidewall erosion and reduced undercutting. This contrasts with isotropic etching, wherein the removal of material is achieved at a more uniform rate over all exposed surfaces. The etch conventionally used to define the cell plates is a reactive ion etch (a "dry" etch). The speed and direction of the etch is affected by the energy (or pressure) imparted to the particles which bombard the exposed surfaces.

FIG. 3 shows the results of an ideal cell formation process using an anisotropic etch. Typically, however, the structure appears as shown in FIG. 4 after formation of the word lines 20, a layer of dielectric 28 over the word lines 20, the cell poly layer 42, and after depositing a layer of photoresist 40. Process etch steps leading to the FIG. 4 structure result in a retrograde sloping of the dielectric 28 as shown, especially with the use of tetraethyl orthosilicate (TEOS) which is commonly used.

A subsequent high pressure anisotropic plasma etch with a material such as chlorine ($Cl_2$) forms the structure of FIG. 5. The high pressure etch undercuts 50 the poly storage plate 30 as shown and decreases its size and therefore its storage capacity. In addition to reducing the storage capacity of the cell, undercutting the poly can result in sharp points of poly which can shear off and cause unwanted shorts on the die surface.

To reduce the undercutting of the storage plate a low pressure plasma etch can be substituted for the high pressure etch. This, however, would leave the poly "stringers" 52 as shown in FIG. 5. The conductive poly stringers 52 which result from the low pressure etch can cause shorts between subsequently formed conductive layers, and are therefore undesirable. In addition to forming stringers, a low pressure etch requires a longer etch time which can reduce output.

Note that FIG. 5 is for description only, and shows the disadvantages of a high pressure etch (undercutting of the storage cell) and of a low pressure etch (the incomplete removal of the exposed poly to form stringers). A high pressure etch does not typically result in the unwanted poly stringers because the high pressure etch has relatively high isotropic properties due to the high kinetic energy imparted onto the etch particles. A low pressure etch would not typically result in the undercutting as shown because of the high anisotropic properties of a low pressure etch. Also, in a typically formed cell one of the word lines of FIGS. 2–5 would be formed over a layer of field oxide as can be determined from the structure of FIG. 1. An actual cell design which uses the invention can easily be determined from the description and Figures herein.

An etch process which maintains a high etch rate without undercutting and which removes the poly stringers between the word lines would be a desirable process.

SUMMARY OF THE INVENTION

An object of the invention is to provide a method of etching a layer of material which results in minimal undercutting of the capacitor storage plate. Another object of the invention is to provide an etch process which removes the poly stringers between the word lines. A third object of the invention is to provide an etch process which has an etch rate which is sufficient for maintaining production throughput.

These and other objects of the invention are realized by providing a reactive ion etch (RIE) comprising a chlorine plasma etch with added particles of $SF_6$ or $NF_3$ at low pressure under magnetic influences. The magnetic force increases the etch rate and isotropic properties of the etch to allow for sufficient stringer removal. A sufficient anisotropic etch property is maintained, however, so that the storage plate poly is not undercut.

DETAILED DESCRIPTION OF THE INVENTION

The inventive process uses $NF_3$ or $SF_6$ in conjunction with a plasma etch under controlled magnetic influences and a low pressure to allow an etch having little undercutting of the material which is being etched and with sufficient isotropic properties to allow for the removal of stringers. The inventive process was carried out on a reactive ion etcher, specifically an Applied Materials 5000, although any etcher which is capable of controlling the pressure, magnetism, and plasma composition as described herein would function sufficiently.

The inventive process was used to manufacture a storage plate of a capacitor in the manufacture of a dynamic random access memory (DRAM) die, although the process is applicable to any type of poly processing where the increased resistivity (reduced conductivity) from cell to cell by the removal of polycrystalline silicon is desired.

Figure 1:
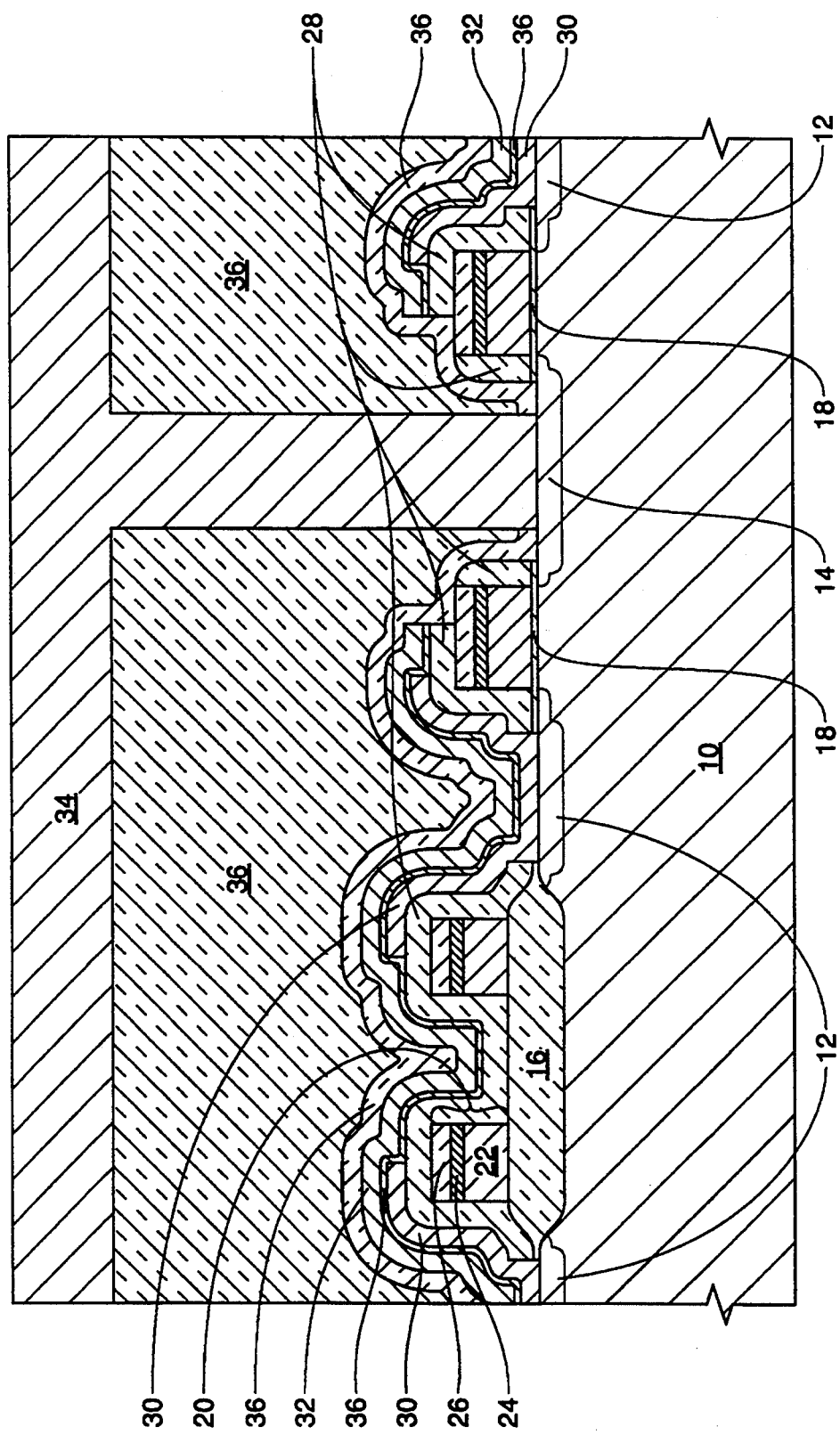
FIG. 1 shows a conventional stacked capacitor cell design.
Figure 2:
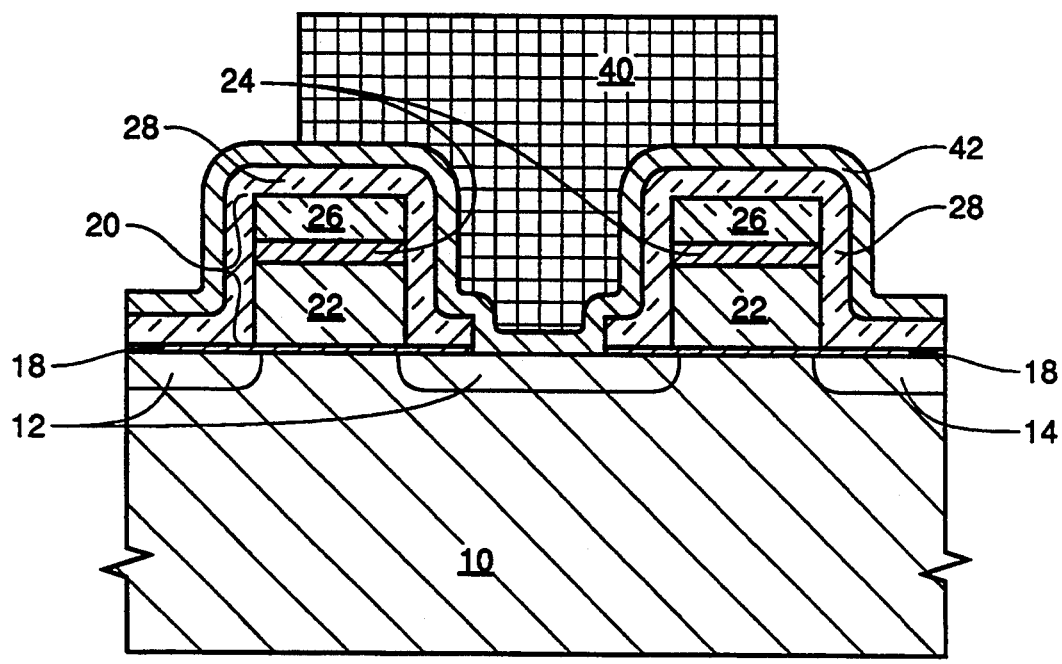
FIG. 2 shows an ideal structure having a layer of photoresist over a poly layer in preparation of forming a capacitor storage cell.
Figure 3:
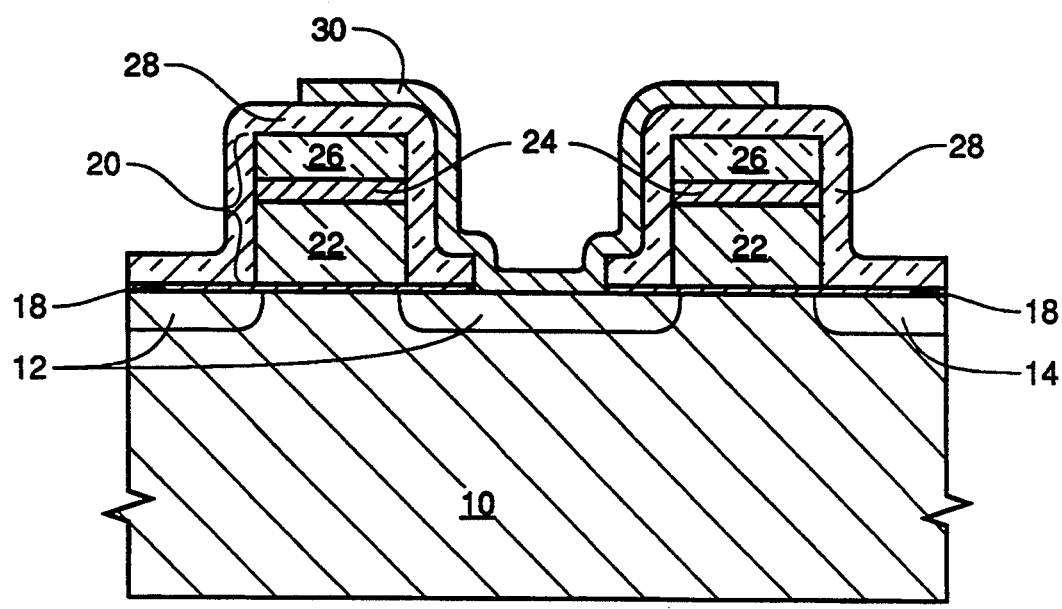
FIG. 3 shows an ideal capacitor storage cell plate having no undercutting or stringers.
Figure 4:
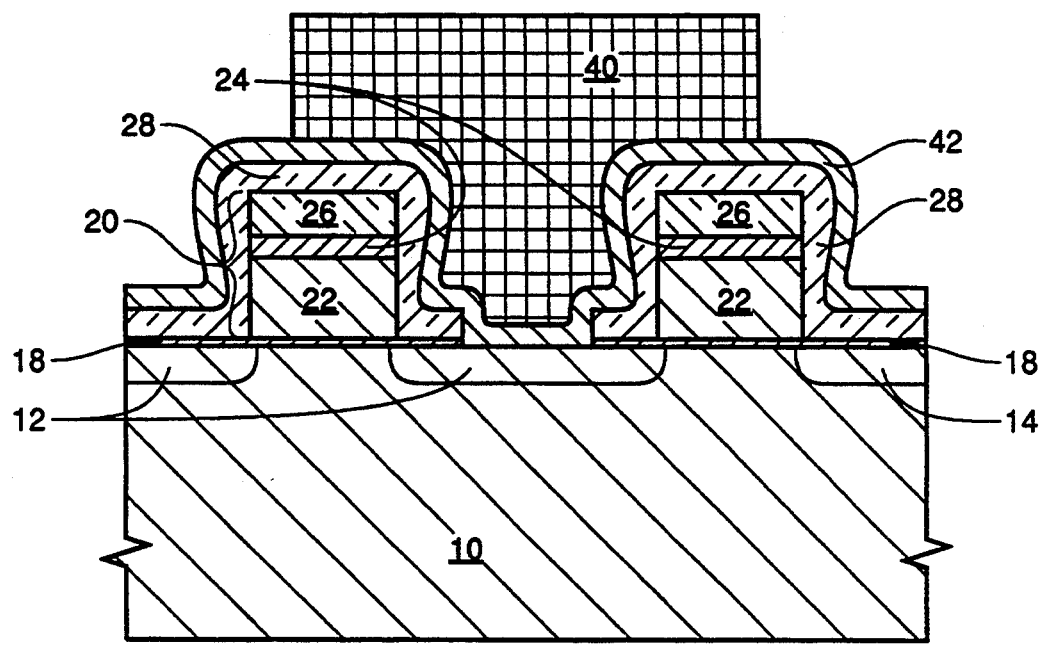
FIG. 4 shows a conventional structure having sloped dielectric formation over a word line and a patterned layer of photoresist in preparation to form the FIG. 5 structure.
Figure 5:
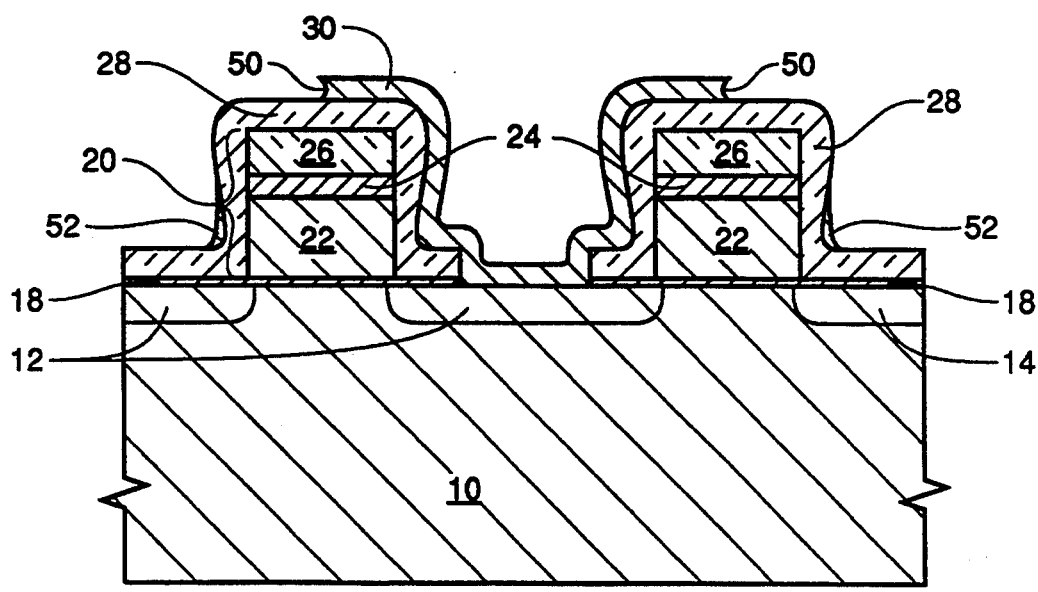
FIG. 5 shows the FIG. 4 structure after an etch and resist removal having stringers and undercutting.

A cell structure was manufactured as shown in FIG. 4 to have word lines 20, a layer of dielectric 28 (TEOS in the instant case), a layer of polycrystalline silicon 42, and a patterned layer of photoresist 40 over the poly layer 42.

The structure of FIG. 4 was subjected to a chlorine RIE, the chlorine being present in the plasma at a concentration of from 20 standard cubic centimeters (sccm) to 70 sccm. However, the addition of carbon to the etch gas, for example in the form of hydrocarbons or halocarbons is to be avoided. It was found that carbon adversely affected the etch by increasing the amount of polymerization which occurs on the feature sidewall. These halogen or hydrocarbon compounds deposited on the sidewalls act to block the etch of silicon/conductive residuals which for the undesirable shorts. By avoiding carbonated feed gasses, this mechanism is substantially reduced. Some carbon may remain in the etch chamber from previous steps, but the amount of carbon in the chamber should be minimized. Thus, a carbon-free etch gas is provided, although some carbon may remain in the chamber. In addition to the chlorine, nitrogen trifluoride ($NF_3$) was added to the plasma in a concentration ranging from 2 to 20 sccm. The addition of fluorinated gas was found to remove any native oxide on the poly surface which may inhibit the stringer removal. This acts to increase the isotropic nature of the etch. Concentrations of $NF_3$ above 20 sccm increased the likelihood of etching the material underlying the poly layer, such as the gate oxide. At under 2 sccm the etch was essentially an RIE of pure chlorine which has the disadvantages listed above.

The pressure of the etch was controlled to be below within the range of about 50 millitorr (mt) to about 10 mt, with about 20 mt being preferable. At higher pressures, plasma particle trajectories are randomized due to the reduction of mean free path, and thus results in a high number of particle collisions. The randomized trajectories of plasma particles produce isotropic etching, the extent being directly controllable by pressure. Above 50 mt the isotropic etch cell loss becomes unacceptable. At low pressure the mean free path of plasma particles becomes large so that particles travel greater distances between collisions which allows etching to take place in a substantially vertical direction. Pressures below those described herein were found to produce stringers.

The Applied Materials 5000 is capable of controlling the magnetic force under which the etch takes place. It was found that a force of between about 75 to 150 gauss produced sufficient results, with about 125 gauss being preferable. The magnetic force influencing the plasma was found to increase the etch rate, which was otherwise insufficient for production due to the low pressure of the etch. The magnetic force was also found to be proportional with the isotropic properties of the etch. At lower gauss ranges it was found that stringer removal was difficult due to the high degree of anisotropic etch properties. Above 130 gauss, however, it was difficult to control the capacitor plate size due the increased undercutting.

It was found that the etch as described herein was similar and sufficient when sulfur pentafluoride ($SF_6$) was substituted in similar concentrations for $NF_3$. A mixture of the two gasses would also be adequate. With either material, stringers were eliminated and undercutting of the poly storage plate was minimized.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

We claim:

1. A process for removing polycrystalline silicon from the surface of a substrate during the formation of a semiconductor device with an etch in a chamber, said etch comprising the following steps:

a) providing a carbon-free etch gas comprising chlorine;
b) adding a compound selected from the group consisting of $SF_6$ and $NF_3$ to said etch gas;
c) applying a pressure within said chamber of less than 50 millitorr;
d) applying a magnetic force of between 75 gauss and 150 gauss to said etch gas in a direction parallel with said surface.

2. The process of claim 1 wherein said pressure applied within said chamber is greater than 10 millitorr.

3. The process of claim 1 wherein said pressure applied within said chamber is about 20 millitorr.

4. The process of claim 1 wherein said compound is added to said etch gas to a concentration of between 2 standard cubic centimeters and 20 standard cubic centimeters.

5. The process of claim 1 wherein said etch gas comprises chlorine in a concentration of between 20 standard cubic centimeters and 70 standard cubic centimeters.

6. The process of claim 1 wherein said magnetic force applied to said etch gas is between about 120 gauss and 130 gauss.

7. The process of claim 1 wherein said compound added to said etch gas comprises both $SF_6$ and $NF_3$.

8. The process of claim 1 wherein said polycrystalline silicon layer is formed over a layer of tetraethyl orthosilicate.

9. A process for forming a memory storage device having a stacked capacitor design comprising the removal of polycrystalline silicon from the surface of a substrate with an etch in a chamber, said etch comprising the following steps:
a) providing a carbon-free etch gas comprising chlorine within said chamber;
b) adding a compound selected from the group consisting of $SF_6$ and $NF_3$ to said etch gas;
c) applying a pressure within said chamber of less than 50 millitorr;
d) applying a magnetic force of between 75 gauss and 150 gauss to said etch gas in a direction parallel with said surface.

10. The process of claim wherein said pressure applied within said chamber is greater than 10 millitorr.

11. The process of claim 9 wherein said pressure applied within said chamber is about 20 millitorr.

12. The process of claim 9 wherein said compound is added to said etch gas to a concentration of between 2 standard cubic centimeters and 20 standard cubic centimeters.

13. The process of claim 9 wherein said etch gas comprises chlorine in a concentration of between 20 standard cubic centimeters and 70 standard cubic centimeters.

14. The process of claim 9 wherein said magnetic force applied to said etch gas is between about 120 gauss and 130 gauss.

15. The process of claim 9 wherein said compound added to said etch gas comprises both $SF_6$ and $NF_3$.

16. The process of claim 9 wherein said polycrystalline silicon layer is formed over a layer of tetraethyl orthosilicate.

17. A process for etching polycrystalline silicon with an etch in a chamber, said etch comprising the following steps:
a) providing a carbon-free etch gas comprising chlorine in a concentration of between 20 standard cubic centimeters and 70 standard cubic centimeters;
b) adding a compound selected from the group consisting of $SF_6$ and $NF_3$ to said etch gas in a concentration of between 2 standard cubic centimeters and 20 standard cubic centimeters;
c) applying a pressure within said chamber of between 10 millitorr and 50 millitorr;
d) applying a magnetic force of between 75 gauss and 150 gauss to said etch gas in a direction parallel with said surface.

18. The process of claim 17 wherein said pressure applied within said chamber is about 20 millitorr.

19. The process of claim 17 wherein said magnetic force applied to said etch gas is between about 120 gauss and 130 gauss.

20. The process of claim 17 wherein said polycrystalline silicon layer is formed over a layer of tetraethyl orthosilicate.

21. A process for removing polycrystalline silicon from the surface of a substrate during the formation of a semiconductor device with an etch in a chamber, said etch comprising the following steps:
a) providing a carbon-free etch gas consisting essentially of chlorine and a compound selected from the group consisting of $SF_6$ and $NF_3$;
b) applying a pressure within said chamber of less than 50 millitorr;
c) applying a magnetic force of between 75 gauss and 150 gauss to said etch gas in a direction parallel with said surface.

* * * * *